(12) United States Patent
Kohara et al.

(10) Patent No.: US 7,169,485 B2
(45) Date of Patent: Jan. 30, 2007

(54) MULTILAYER COATING EXCELLENT IN WEAR RESISTANCE AND HEAT RESISTANCE

(75) Inventors: Toshimitsu Kohara, Takasago (JP); Hiroshi Tamagaki, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 11/174,551

(22) Filed: Jul. 6, 2005

(65) Prior Publication Data
US 2006/0014041 A1 Jan. 19, 2006

(30) Foreign Application Priority Data
Jul. 16, 2004 (JP) .............................. 2004-210536

(51) Int. Cl.
*B32B 9/00* (2006.01)

(52) U.S. Cl. ...................... 428/701; 428/212; 428/336; 428/697; 428/698; 428/699; 428/702

(58) Field of Classification Search ................ 428/697, 428/698, 699, 701, 702, 336, 212
See application file for complete search history.

(56) References Cited

U.S. PATENT DOCUMENTS

| | | | |
|---|---|---|---|
| 4,018,631 A * | 4/1977 | Hale ............................ | 428/702 |
| 5,693,417 A | 12/1997 | Goedicke et al. | |
| 6,086,953 A | 7/2000 | Raghavan et al. | |
| 6,156,383 A * | 12/2000 | Ishii et al. ................ | 427/249.1 |
| 6,254,984 B1 * | 7/2001 | Iyori ........................... | 428/701 |
| 6,333,103 B1 * | 12/2001 | Ishii et al. ................... | 428/336 |
| 2002/0028323 A1 | 3/2002 | Nakamura et al. | |
| 2003/0027015 A1 | 2/2003 | Schiller et al. | |
| 2005/0058850 A1 | 3/2005 | Kohara et al. | |
| 2005/0276990 A1 * | 12/2005 | Kohara et al. ............... | 428/698 |

FOREIGN PATENT DOCUMENTS

| | | |
|---|---|---|
| DE | 41 10 006 A1 | 10/1992 |
| EP | 1 553 210 A1 | 7/2005 |
| JP | 2002-53946 | 2/2002 |
| WO | WO 2004/15170 A1 | 2/2004 |

OTHER PUBLICATIONS

U.S. Appl. No. 11/174,551, filed Jul. 6, 2005, Kohara et al.
U.S. Appl. No. 10/523,931, filed Feb. 7, 2005, Kohara et al.
U.S. Appl. No. 10/523,815, filed Feb. 4, 2005, Kohara et al.
U.S. Appl. No. 10/554,601, filed Oct. 27, 2005, Tamagaki et al.
U.S. Appl. No. 10/551,993, filed Oct. 4, 2005, Tamagaki et al.

* cited by examiner

*Primary Examiner*—Archene Turner
(74) *Attorney, Agent, or Firm*—Oblon, Spivak, McClelland, Maier & Neustadt, P.C.

(57) ABSTRACT

A multilayer coating according to the present invention comprises an alumina coating formed, directly or through an intermediate layer, on a hard coating composed of a metallic compound formed on the base material, and the Vickers hardness of the hard coating after alumina coating formation being 22 GPa or more. The multilayer coating is excellent in adhesion between a hard coating and an alumina coating and capable of exhibiting excellent wear resistance and heat resistance over a long period.

14 Claims, 1 Drawing Sheet

MULTILAYER COATING EXCELLENT IN WEAR RESISTANCE AND HEAT RESISTANCE

BACKGROUND OF THE INVENTION

1. Field of the Invention

The present invention provides a multilayer coating excellent in wear resistance and heat resistance and, more specifically, a multilayer coating including an alumina coating formed on a hard coating to be applied to a wear resistant member such as a cutting tool, a sliding member or a die. The multilayer coating is excellent in the adhesion between the alumina coating and the hard coating and can keep satisfactory wear resistance and heat resistance over a long period while preventing peeling of the alumina coating from the hard coating.

Although an alumina coating obtained by the present invention is applicable to various purposes as described above, its application to a cutting tool will be mainly illustrated hereinafter as a typical example.

2. Description of the Related Art

In a cutting tool or sliding member which requires excellent wear resistance or sliding characteristic, it has been generally adapted to ensure the heat resistance by forming a hard coating of titanium nitride, titanium aluminum nitride or the like on a base material surface of high-speed steel, cemented carbide or the like by means of chemical vapor deposition (hereinafter referred to as CVD method), and further forming an aluminum oxide (particularly, α-alumina having corundum structure) thereon.

However, since heating of the base material to 1000° C. or higher is required, particularly, when the α-alumina having corundum structure is formed by the CVD method, applicable base materials therefor are limited. A certain kind of base materials softens, when exposed to a high temperature of 1000° C. or higher, and loses the suitability as a base material for wear resisting member. Even a high-temperature base material such as cemented carbide causes a problem such as deformation, when exposed to such a high temperature.

In order to solve the above problems, a process using physical vapor deposition (hereinafter referred to as PVD method) capable of forming α-alumina at a relatively low temperature has been proposed. For example, Japanese Patent Laid-Open No. 2002-53946 discloses a process for forming, by use of an oxide coating of corundum structure (α-type crystal structure) with a lattice parameter of 4.79 Å or more and 5.000 Å or less and a film thickness of at least 0.005 μm as an under layer, an alumina coating of α-type crystal structure on this under layer. According to this process, the component of the oxide coating preferably consists of any one of $Cr_2O_3$, $(Fe,Cr)_2O_3$, and $(Al,Cr)_2O_3$, $(Fe_x,Cr_{(1-x)})_2O_3$ (x: $0 \leq x \leq 0.54$) is more preferably adapted when the component of the oxide coating is $(Fe,Cr)_2O_3$, and $(Al_y,Cr_{(1-y)})2O_3$ (y: $0 \leq y \leq 0.90$) is more preferably adapted when the component of the oxide coating is $(Al,Cr)_2O_3$.

It is also denoted in Japanese Patent Laid-Open No. 2002-53946 that crystalline α-alumina can be formed even at a relatively low base material temperature by adapting a process for forming a composite nitride coating of one or more elements selected from the group consisting of Ti, Cr and V with Al as a hard coating, forming a coating composed of $(Al_z,Cr_{(1-z)})N$ (z: $0 \leq z \leq 0.90$) as an intermediate layer, oxidizing this coating to form an oxide coating of corundum structure (α-type crystal structure), and forming α-type alumina on the oxide coating.

The present inventors also have proposed, in order to obtain a coating excellent in heat resistance and wear resistance, to form a TiAlN coating on the surface of a cutting tool or the like as a hard coating and further form an alumina coating mainly composed of α-type crystal structure on this coating (WO2004/015170). Specifically, the process comprises the steps of forming the hard coating (TiAlN coating) on a base material, oxidizing the surface of the hard coating to form an oxide-containing layer, and forming the alumina coating mainly composed of α-type crystal structure on the oxide-containing layer.

According to the process described in WO2004/015170, the productivity is improved, compared with a process comprising the steps of forming a CrN coating after forming a TiAlN coating, oxidizing the CrN coating to form $Cr_2O_3$ of corundum structure, and then forming the alumina coating mainly composed of α-type crystal structure thereon as in Japanese Patent Laid-Open No. 2002-53946. Further, the deterioration of cutting performance by a Cr-containing coating such as $Cr_2O_3$ layer or $(CrN+Cr_2O_3)$ composite layer to be formed as the intermediate coating can be also avoided.

However, this method retains the potential to cause the peeling of the hard coating (TiAlN coating) from the base material similarly to the case of Japanese Patent Laid-Open No. 2002-53946, since the base material temperature needs to be raised to about 700 to 750° C. in an oxidizing atmosphere when the alumina mainly composed of α-type crystal structure is formed on the oxide-containing layer after oxidizing the surface of the hard coating (TiAlN coating).

In view of the above-mentioned problem, the present inventors have also proposed to keep the adhesion between the base material and the hard coating by preliminarily forming, in case of forming a hard coating composed of a compound of a metallic component containing Al and Ti as essential components with C, N, B, O, etc., at least one layer selected from the group consisting of metallic layers and alloy layers to be oxidized at a temperature lower than 700° C., which is lower than the oxidizing temperature of the hard coating, and compound layers of such metals or alloys with C, N, B, O, etc. on the base material as an under layer.

However, even if such a multilayer coating is formed, deterioration of adhesion may be caused between the hard coating and the alumina coating in a remarkably severe use environment, and excellent wear resistance and heat resistance cannot be sufficiently maintained.

SUMMARY OF THE INVENTION

The present invention has been achieved in view of the circumstances, and has an object to provide a multilayer coating which is excellent in the adhesion between the hard coating and the alumina coating and can exhibit excellent wear resistance and heat resistance over a long period.

A multilayer coating according to the present invention includes a hard coating composed of a metallic compound formed on a base material and an alumina coating formed on the hard coating directly or through an intermediate layer, wherein the Vickers hardness of the hard coating after alumina coating formation is 22 GPa or more.

Examples of the multilayer coating include a multilayer coating formed by successively laminating a hard coating composed of a metallic compound, an oxide-containing layer formed by oxidizing the surface of the hard coating, and an alumina coating, and a multilayer coating formed by successively laminating a hard coating composed of a metallic compound, an intermediate layer composed of a metal or a metallic compound, an oxide-containing layer formed by oxidizing the surface of the intermediate layer, and an alumina coating.

The alumina coating preferably has a crystal structure mainly composed of α-type crystal structure.

The hard coating is preferably composed of a compound of a metallic component containing Al and Ti as essential components with B, C, N, O, etc., or includes a surface layer composed of this compound. Particularly preferably, the hard coating is composed of TiAlN or TiAlCrN or includes a surface layer composed of TiAlN or TiAlCrN.

The intermediate layer is preferably composed of metal Cr or a compound of a metallic component containing Cr as essential component with B, C, N, O, etc. and, particularly preferably, composed of CrN.

According to the present invention, since a multilayer coating including an alumina coating formed, directly or through an intermediate layer, on a hard coating composed of a metallic compound is excellent in the adhesion between the alumina coating and a lower layer (particularly, the hard coating), peeling of the alumina coating can be suppressed even in its application to a cutting tool or the like which is used in a severe use environment. As a result, a cutting tool, a sliding member or the like capable of exhibiting excellent wear resistance or heat resistance over a long period can be provided.

DESCRIPTION OF THE PREFERRED EMBODIMENTS

Figure 1:
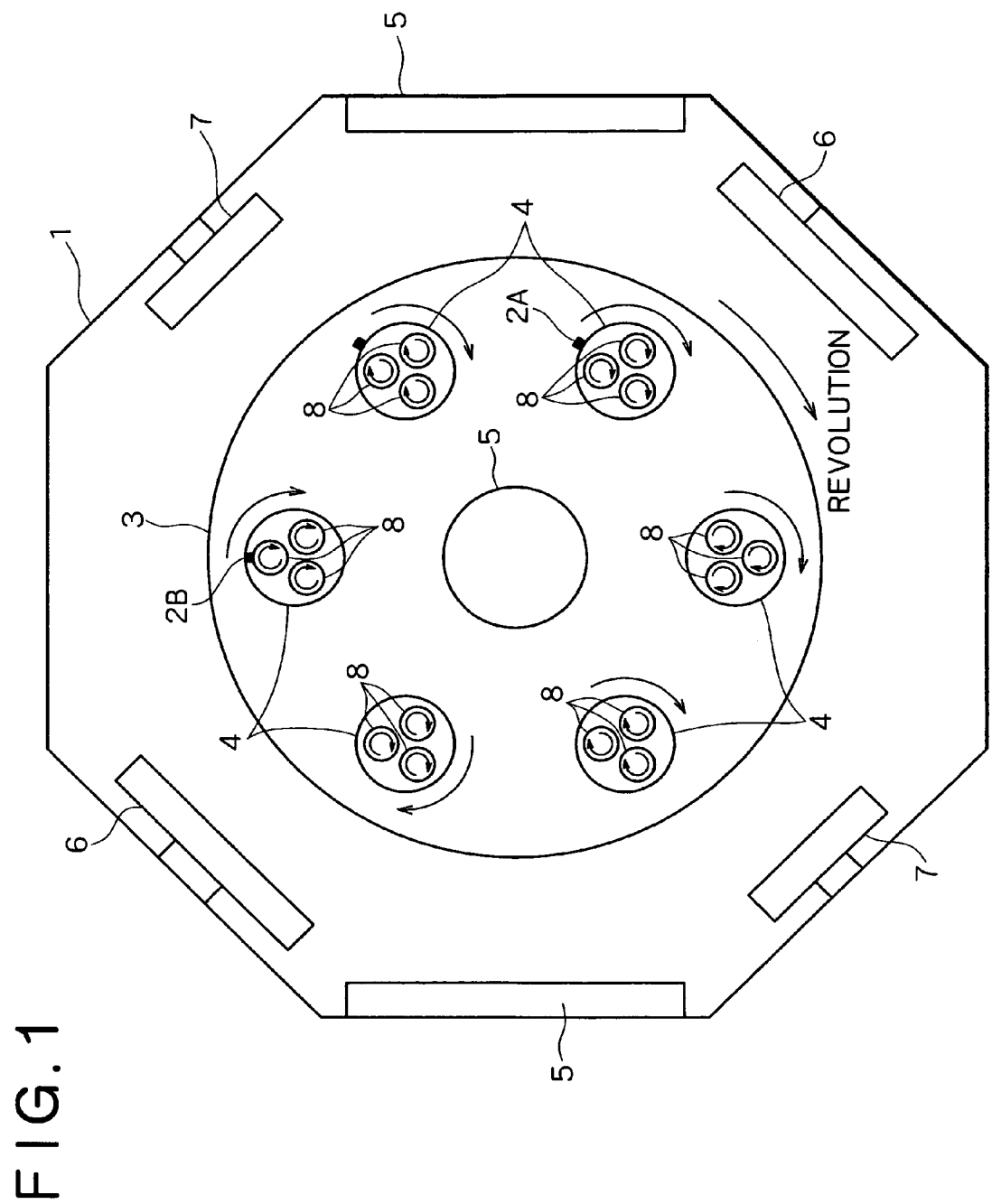
FIG. 1 is a schematic view (upper surface view) showing an example of a device used for execution of the prevent invention.

The present inventors conducted earnest studies to obtain a multilayer coating capable of exhibiting performances such as excellent wear resistance and heat resistance over a long period, particularly, a multilayer coating excellent in adhesion between a hard coating and an alumina coating. Specifically, with respect to a multilayer coating obtained by forming a hard coating while changing its forming condition and then forming an alumina coating thereon, and a multilayer coating obtained by forming a hard coating while changing its forming condition, forming an intermediate layer or oxide-containing layer described later, and further forming an alumina coating thereon, experiments were carried out to evaluate the adhesion between the alumina coating and a lower layer (particularly, hard coating) and the cutting performance of multilayer coating.

As a result, it was found that the adhesion between the alumina coating and the hard coating is important, and this adhesion can be enhanced by controlling the Vickers hardness of the hard coating after alumina coating formation. It was also found that the deformation of the base material or the multilayer coating by application of an external force is increased when the hardness is low, resulting in deterioration of the adhesion between the alumina and the hard coating and in deterioration of the cutting performance.

It is also grasped that, even if the intermediate layer or oxide-containing layer is present between the hard coating and the alumina coating, such a coating hardly affects the adhesion with the alumina coating.

The hardness of the hard coating is varied between before and after the formation of the alumina coating as described later. For example, a TiAlN coating was formed as the hard coating in a device shown by examples described later by an AIP method with constant base material temperature: 550° C. while changing the bias voltage to be applied to the base material to three levels of −30V, −100V and −200V to measure the hardness of the TiAlN coating. In this case, the hardness of the TiAlN coating was about 21 GPa, 23 GPa and 27 GPa at bias voltages: −30V, −100V and −200V, respectively. Thereafter, an α-alumina coating 3.5 μm thick was formed on the hard coating by reactive sputtering with a base material temperature: 750° C., and the alumina coating was then polished and removed to measure the hardness of the resulting TiAlN coating (hard coating). In this case, the hardness was about 20 GPa, 22 GPa and 25 GPa, respectively. From this result, it is found that the TiAlN coating (hard coating) slightly softens in the formation of the alumina coating in a high temperature regardless of the bias voltage.

Accordingly, in the present invention, the Vickers hardness of the hard coating after alumina coating formation is regulated so that the hardness is 22 GPa or more, whereby the deformation of the multilayer coating or the base material can be minimized to satisfactorily keep the adhesion between the hard coating and the alumina coating even in case of the application of the external force to the multilayer coating as in cutting by a tool or in punching by a die. The Vickers hardness of the hard coating after alumina coating formation is preferably set to 25 GPa or more. On the other hand, since an excessively high hardness of the hard coating impairs the adhesion with the base material, the hardness is preferably controlled to 50 GPa or less.

Since the temperature of the alumina coating formation is usually higher than that of the hard coating formation, the hard coating is softened by the alumina coating formation in most cases. This softening is considered to be due to release of a compression stress in the hard coating. On the other hand, when the temperature of the alumina coating formation is not more than that of the hard coating formation, the hard coating is never hardened by the alumina coating formation. Accordingly, in the present invention, the hardness of the hard coating before the alumina coating formation needs to be 22 GPa or more.

The present inventors also examined the process for obtaining a hard coating having such hardness. The result is shown below.

As described above, the TiAlN coating was formed as the hard coating in the device shown in examples described later by AIP method with conditions of base material temperature: 550° C. and bias voltage to be applied to the base material: −100V. The measured hardness of the TiAlN coating was 23 GPa. The hardness of the TiAlN coating (hard coating) after forming the α-alumina coating 3.5 μm thick on the hard coating by reactive sputtering with a base material temperature of 750° C. and polishing and removing the alumina coating was reduced to 22 GPa by 1 GPa.

Then, formation of a hard coating was carried out with a lowered base material temperature of 450° C. Namely, a TiAlN coating was formed as the hard coating by AIP method with conditions of base material temperature: 450° C. and bias voltage to be applied to the base material: −100V, and an α-alumina coating was formed thereon in the same manner as the above. As a result, the hardness of the TiAlN coating before alumina coating formation was 23 GPa similarly to the above case with base material temperature: 550° C., while the hardness of the TiAlN coating measured after forming the alumina coating and polishing and removing the alumina coating was reduced to about 20 GPa by 3 GPa.

Namely, the formation of the TiAlN coating carried out with a lowered base material temperature of 450° C. increased the degree of softening of the hard coating by the alumina coating formation. This is attributable to that the compression stress in the TiAlN coating formation is released in the alumina coating formation in the hard coating formation, since the difference in base material temperature between in the TiAlN coating formation and in the alumina coating formation in the hard coating formation with base material temperature: 450° C. is larger than that in the hard coating formation with base material temperature: 550° C.

When the temperature of the hard coating formation is excessively high, the heat softens, deforms and deteriorates the base material. When the temperature of the hard coating formation is excessively low, the alumina coating formation softens the hard coating too much. Accordingly, the temperature of the hard coating formation preferably as close to the temperature of the alumina coating formation as possible, so long as the temperature of the hard coating formation does not exceed the temperature of the alumina coating formation. The preferable range of the temperature of the hard coating formation is −200 to 0° C. relative to the alumina coating formation temperature. For example, when the alumina coating formation temperature is 750° C., TiAlN coating as the hard coating is preferably formed in 550 to 750° C.

Based on these experimental results, the base material temperature in hard coating formation is set to 500° C. or higher in the present invention, preferably, to 550° C. or higher. On the other hand, the upper limit of the base material temperature should be controlled to lower than 1000° C. according to the object of the present invention. In the present invention, the hard coating can be formed even at 800° C. or lower.

In the hard coating formation, the bias voltage to be applied to the base material can be controlled to make the hard coating highly hard. Since an excessively low bias voltage makes it difficult to increase the hardness of the coating, the voltage is preferably set to −100V or more (increasing the absolute value; more preferably −200V or more). On the other hand, since an excessively high bias voltage might adversely cause etching of the coating formed on the base material or deterioration of the adhesion by promoted hardening of the hard coating, the upper limit is preferably set to −300V or lower (decreasing the absolute value).

The material of the hard coating is not limited to the TiAlN shown as an example, and any material composed of a metallic compound may be adapted. Particularly, a hard coating consisting of a compound composed of a metallic component containing Al and Ti as essential components with B (boron), C (carbon), N (nitrogen), O (oxygen), etc., which is frequently used as hard coating in a cutting tool or the like; or a hard coating consisting of a plurality of multilayers or having a component composition inclined (stepwise or continuously) from the base material side to the coating surface side, the surface layer of which is composed of the above-mentioned compound, can be desirably used since such a hard coating itself has heat resistance and wear resistance.

Specific examples of the compound forming the hard coating include nitrides, carbides, carbonitrides, borides, oxynitrides, carbonxynitrides and the like of Al and Ti, and more specifically, include TiAlN, TiAlC, TiAlCN, TiAlNO, and the like. Further, a hard coating composed of a compound with C, N, B, O, etc. containing Al and Ti as essential components and further at least one element selected from the group consisting of the groups IVa (except Ti), Va, VIa and Si as a third element can be also used. Specific examples thereof include TiAlCrN, TiAlVN, TiAlSiN, TiAlZrN, TiAl-SiCN, TiAlZrCN and the like.

Among them, particularly, a hard coating composed of TiAlN or TiAlCrN, or a hard coating having a surface layer composed of this compound is suitably used, since high heat resistance and wear resistance can be expected, and a stable forming method thereof is established. In application of the TiAlN coating as the hard coating, the composition ratio of Ti to Al can be optionally set, but a preferable Ti:Al ratio is within the range of 50:50 to 25:75 by atomic ratio.

The hard coating may be a coating the composition of which is changed with a gradient from the base material side to the coating surface side as described above or a combination thereof, in addition to a single-layer coating and a multilayer coating consisting of a plurality of layers.

The film thickness of the hard coating is set preferably to 0.5 μm or more, more preferably, to 1 μm or more, since the above effect cannot be exhibited with an extremely small thickness. Since an excessively large thickness causes cracking of the coating at the time of cutting, the thickness is set preferably to 20 μm or less, more preferably to 10 μm or less.

The method for forming the hard coating is not particularly limited. In order to readily form a hard coating (particularly, TiAlN coating) with an Al atomic ratio increased to enhance wear resistance and heat resistance, a PVD method is preferably adapted. As the PVD method, AIP (ion plating) is more preferably adapted. The adaptation of the PVD method for the formation of the hard coating is also preferable from the point of improvement in productivity, since the hard coating formation and the alumina coating formation described later can be performed within the same device.

At the time of hard coating formation, an under layer may be preliminarily formed on a base material in order to enhance the adhesion between the base material and the hard coating. As the under layer, at least one layer selected from the following group, which is more easily oxidized than the hard coating (particularly, in which oxidation can progress even at a temperature lower than 700° C.) is formed:

(a) a metallic layer;
(b) an alloy layer; and
(c) a compound layer of such a metal or alloy with C, N, B, O, etc.

By forming such a coating, oxygen diffused into the hard coating through pinholes of the coating or the like can be absorbed by forming an oxide in the coating, thereby preventing the formation of a brittle layer in the interface between the base material and the hard coating by the oxygen which reached the base material.

Specific examples of the under layer include a Ti metal layer, a Zr metal layer, a Si layer, and the like. The Ti metal layer is preferred since it is easily oxidized to form a Ti oxide. Otherwise, when a compound is used as the under layer, a compound layer of Ti with C, N, B, O, etc. is preferred since it is easily oxidized and has high hardness to be also used as the hard coating.

The under layer is set to a thickness of 10 μm or less since an excessively large thickness facilitates cracking at the time of cutting and deteriorates the adhesion with the base material. On the other hand, in order to sufficiently prevent the diffusion of oxygen in the base material, it is preferable to ensure a thickness of 0.1 μm or more.

The α-crystallization of the alumina coating can be promoted by forming an intermediate layer composed of a metal or a metal compound on the hard coating. An intermediate layer composed of a metal or a metal compound and having the same corundum crystal structure as α-alumina (including the case where the crystal structure becomes the same corundum structure as α-alumina by an oxidation treatment described below) can be formed as a template for the alumina coating. As such an intermediate layer, particularly, metal Cr or a compound of C, N, B, O, etc. containing Cr as an essential element can be preferably formed. According to this, $Cr_2O_3$ that is an oxide of α-type corundum structure is formed on the surface at the time of oxidation treatment or alumina coating formation, and the α-crystallization of the alumina coating is promoted. Particularly, CrN can be preferably formed as the intermediate layer since the CrN coating itself can exhibit heat resistance and wear resistance to some degree, and the coating can be easily formed by the PVD method.

The intermediate layer is preferably set to a thickness of 0.5 μm or less (more preferably, 0.1 μm or less) since an excessively large thickness causes deterioration of hardness of the multilayer coating, minimizing the effect of enhancing the hardness of the hard coating. On the other hand, since an excessively small thickness makes it difficult to form a uniform layer, the thickness preferably is set to 5 nm or more, more preferably, to 10 nm or more.

The method for forming the intermediate layer is also not particularly limited, but the intermediate layer is preferably formed by the PVD method. AIP (ion plating) or sputtering is preferably adapted as the PVD method from the point of improvement in productivity, since the hard coating formation, the alumina coating formation described later, and the like can be performed within the same device.

As one of preferred embodiments of the present invention, after forming the hard coating or intermediate layer, an oxide-containing layer the outermost side of which has substantially the same corundum structure as α-alumina is formed by oxidizing the surface of the hard coating or intermediate layer.

The oxidation is preferably carried out in an oxidizing gas-containing atmosphere. This reason is that the oxidation can be efficiently carried out. Examples of such an atmosphere include an atmosphere containing an oxidizing gas such as oxygen, ozone, or $H_2O_2$, and the atmosphere is naturally included therein.

The oxidation is desirably carried out while keeping the substrate temperature at 650–800° C. Since the oxidation cannot sufficiently proceed at an excessively low substrate temperature, the oxidation is desirably carried out at a raised temperature of 700° C. or higher. The higher the substrate temperature is, the more the oxidation is promoted. However, the upper limit of the substrate temperature should be controlled to lower than 1000° C. according to the object of the present invention. In the present invention, an oxide-containing layer useful for formation of an α-type mainly composed alumina coating described below can be formed even at 800° C. or lower.

In the present invention, other conditions of the oxidation treatment are not particularly limited. As a specific example, thermal oxidation which is performed in an oxidizing gas atmosphere at a raised substrate temperature or radiation of an oxidizing gas such as oxygen, ozone, $H_2O_2$ or the like as plasma is preferably adapted.

The oxidation is desirably carried out in the same device used for the alumina coating formation which is carried out in the following process, since intrusion of contaminant can be prevented, and the multilayer coating can be formed with good productivity.

In the formation of the oxide-containing layer by oxidizing the surface of the hard coating or the intermediate layer, the thickness of the oxide-containing layer is also set sufficiently smaller than that of the hard coating, whereby the effect of improving the adhesion by the hardness control of the hard coating can be sufficiently exhibited.

The crystal structure of the alumina coating is not particularly limited. The alumina coating may be mainly composed of α-type crystal structure, mainly composed of γ-type crystal structure, or composed of mixture of α-type crystal structure and γ-type crystal structure. To obtain a multilayer coating capable of exhibiting more excellent wear resistance and heat resistance, formation of an alumina coating mainly composed of α-type crystal structure is desired.

The alumina coating is desirably set to a thickness of 0.1–20 μm. To maintain the excellent heat resistance of the alumina coating, it is effective to ensure a thickness of 0.1 μm or more, more preferably 1 μm or more. However, an excessively large thickness of the alumina coating causes an internal stress or the like in the alumina coating, which facilitates cracking thereof or the like. Accordingly, the film thickness is preferably set to 20 μm or less, more preferably 10 μm or less, further more preferably 5 μm or less.

To prevent the reduction in hardness of the hard coating by the alumina coating formation, it is recommended to form a crystal nucleus of α-alumina at high temperature, for example, in the oxidation and in the initial stage of alumina coating formation, and then reduce the base material temperature on and after the middle stage of the alumina coating formation. According to this, α-alumina can be formed even at a relatively low temperature, and since the temperature is reduced from the middle of the deposition, the thermal load to the hard coating can be minimized to suppress the reduction in hardness.

For example, if the temperatures of the oxidization treatment and the initial stage of the alumina coating formation are set to 750° C. and the temperature after the middle stage of the alumina coating formation is set to 700° C., an alumina coating composed mainly of α-alumina can be obtained.

The method for forming the alumina coating is not particularly limited. However, the CVD method is not preferred because it must be carried out in a high temperature range of 1000° C. or higher. The PVD method which can perform deposition in a low temperature range and form a high-hardness coating while keeping a compression stress can be desirably adapted. Examples of the PVD method include sputtering, ion plating, vapor deposition and the like. Among them, sputtering is preferred, and reactive sputtering is particularly preferred since high-speed deposition can be performed by use of an inexpensive metal target.

The base material temperature in the alumina coating formation is not particularly regulated, but a temperature range of about 650–800° C. is preferred since an α-type-based alumina coating can be easily formed therein. Further, it is further preferred to form the α-type-based alumina coating while keeping the base material temperature in the oxidation treatment successively to the oxidation treatment process, since the characteristics of the base material and the hard coating can be maintained, and excellent productivity can be ensured.

In the case of providing an intermediate layer, a step of forming the intermediate layer may be added between the step of the hard coating formation and the step of the alumina coating formation. The intermediate layer can be formed in various ways. For example, it can be easily formed by AIP method or sputtering method (applied to the alumina coating formation). Since a thin intermediate layer does not much affect the adhesion between the hard coating and the alumina coating, there is no particular limitation in the hardness of the intermediate layer, the temperature of the intermediate layer formation and the other conditions of the intermediate layer formation.

More preferably, all the processes of the hard coating formation, the intermediate layer formation, the oxidation treatment and the alumina coating formation are carried out in the same device. According to this, adhesion of contaminant or the like to the coating interfaces can be prevented, and since the treatment can be continuously performed without moving a material to be treated, the multilayer coating can be thus efficiently produced.

As a specific example, in a device comprising an AIP evaporation source, a magnetron sputtering cathode, a heater heating mechanism, a base material rotating mechanism, and the like, as is used in the examples described later, a cemented carbide-made base material is set, Ar is introduced in to a vacuum chamber, and a negative DC voltage is applied to the base material, whereby gas ion bombardment is carried out, a hard coating of TiAlN or the like is then formed thereon by use of the AIP method or the like (as occasion demands, an intermediate layer is formed by the AIP method or the like), the surface of the hard coating is thermally oxidized in an oxidizing gas atmosphere such as oxygen, ozone, $H_2O_2$ or the like as described above, and the alumina coating is formed thereon by use of reactive sputtering or the like.

According to the present invention, when such a multilayer coating is applied to a tool clad with multilayer coating, its effect can be sufficiently exhibited. Specific application examples thereof include a cutting tool such as a throwaway chip including TiAlN formed as hard coating on a cemented carbide-made base material, an end mill including TiAlCrN formed as hard coating on a cemented carbide-made base material, or a throwaway chip including TiAlN formed as hard coating on a cermet-made base material; a hot working die used under high temperature, and the like.

The present invention will be further more specifically described in reference to examples. The present invention is never limited by these examples. Proper changes can be made without departing from the range adaptable to the effects described above and later, and it is obvious that they will be included in the technical scope of the present invention.

EXAMPLES

In these examples, formation of a under layer, formation of a hard coating described below, surface oxidation of the hard coating, and formation of an alumina coating were carried out by use of a vacuum deposition device comprising an arc ion plating cathode (hereinafter referred to as AIP cathode), a magnetron sputtering cathode (hereinafter referred to as UBM cathode), a heater mechanism, a base material rotating mechanism and the like (manufactured by Kobe Steel, Ltd., AIP-S40 composite machine) shown in FIG. 1.

This device has six AIP cathodes 7 (three on each side), two UBM cathode 6, and heaters 5 disposed in two wall surfaces and the center position of the device. A table mechanism in FIG. 1 is adapted so that a table 3 is rotated (revolved) first, and planetary rotating jigs 4 disposed thereon are also rotated (about their own axes) in interlocking therewith. In this instance, rotating members 8 are further installed to the planetary rotating mechanism.

In the examples, the formation of the under layer and the hard coating, the surface oxidation, and the alumina coating formation were carried out as described below while attaching a cemented carbide base material (SNMN120408) 2A for multilayer coating evaluation to a base material holding pipe on the planetary rotating mechanism 4, and a cemented carbide base material (SNGA120408) 2B for a cutting test to the rotating jig 8.

2A was polished into mirror surface (Ra=about 0.02 μm), and both 2A and 2B were ultrasonically washed in an alkali bath and in a pure water bath followed by drying prior to application.

The base materials 2A and 2B were set in the device followed by evacuation, and the base materials were heated to about 450° C. or to about 550° C. When the base materials reached a predetermined temperature, the device 1 was made to an Ar atmosphere with a pressure of 2.66 Pa to perform Ar-ion bombardment, and the base material surfaces were cleaned. Thereafter, only three AIP cathodes 7 installed with Ti target were discharged at 150A on one side in a nitrogen atmosphere with nitrogen pressure of 3.99 Pa, while keeping the base material temperature to form a TiN coating as a under layer for improving the adhesion between the base material and the TiAlN coating. Further, three AIP cathodes 7 installed with TiAl target were successively discharged at 150A in a nitrogen atmosphere with the same pressure to form a TiAlN coating as a hard coating. The bias voltage in the formation of the TiN coating and the TiAlN coating was DC, and a voltage of −100V or −300V was applied at the base material temperature of 450° C. A voltage of −30V, −100V or −200V was applied at the base material temperature of 550° C. for deposition.

In examples of forming an intermediate layer on the hard coating (Nos. 9 and 10 in Table 1), after forming the hard coating, one of the UBM cathodes 6 installed with Cr metal target was discharged at DC 1 kW for 2 minutes in Ar atmosphere while keeping the base material temperature at 550° C. to form a Cr metal layer about 10 nm thick on the hard coating.

The oxidation of the hard coating or the intermediate layer was then carried out. The device was evacuated substantially to vacuum in the state where the base materials having the hard coating or intermediate coating formed on the surface were set in the device, and the base materials were heated to about 750° C. by the heaters 5 set in two side surface positions and the center position within the device. When the temperature of the samples reached a predetermined temperature, oxygen gas was introduced into the device 1 at a flow rate of 300 sccm and a pressure of about 0.75 Pa, and retained with heating for 20 minutes to perform the oxidation.

Thereafter, formation of the alumina coating was carried out. In the alumina coating formation, the alumina coating was formed by use of pulse DC sputtering, while applying an average discharge power of about 5 kW in total to two UBM cathodes 6 installed with aluminum target in FIG. 1 with the base material temperature substantially equal to that in the oxidation process described above in an atmosphere of argon and oxygen. As the bias voltage, 30 kHz pulse DC was adapted at −300V During the alumina coating formation, the discharge voltage and the flow rate of oxygen were controlled by means of plasma emission spectrometry to lay the discharging mode in a so-called transition mode. At the time of the alumina coating formation, the base material temperature was slightly raised by the effect of heat input by deposition. The alumina coating was set to two levels of 1.7 μm and 3.5 μm.

By using the sample with the thus-formed multilayer coating, the crystal structure of the alumina coating, the film thickness of the hard coating and the alumina coating, the hardness of the multilayer coating (alumina coating), the hardness of the hard coating (TiAlN) after alumina coating formation, and the adhesion between the hard coating and the alumina coating, and the cutting performance of the multilayer coating were measured and evaluated.

The crystal structure of the alumina coating was confirmed by means of thin film X-ray diffraction analysis (thin film XRD analysis).

The film thickness of the hard coating and the alumina coating were calculated from the coating width of a polishing trace formed after ball wear test (simplified film thickness measurement) using the cemented carbide base material (SNMN120408) with the multilayer coating formed thereon. The film thickness of the tool clearance of the cemented carbide base material (SNMN120408) for a cutting test was about 70% of the measurement value described above.

The hardness of the multilayer coating (alumina coating) was measured by use of a nano-indentation hardness meter after the alumina surface was polished and smoothed in the ball wear test. The hardness of the hard coating (TiAlN) after alumina coating formation was measured by use of a Vickers hardness testing machine. In the measurement of the hardness of the hard coating (TiAlN) after alumina coating formation, a steel ball 30 mm in diameter was rotated on the multilayer coating, and the alumina coating, the intermediate layer or the oxide-containing layer was rubbed and polished (ball wear test) until the hard coating was perfectly exposed, and the hardness of the exposed hard coating was measured.

The adhesion between the hard coating and the alumina coating was evaluated in the following manner. An indentation was formed by executing a Rockwell C indentation test by use of a Rockwell hardness testing machine from above the multilayer coating, a cellophane adhesive tape of JIS Z1522 (adhesive force: 2.94N/10 mm or more) was stuck to the indentation and then peeled to peel the alumina coating, and the circumference of the indentation after peeling was visually observed.

The cutting performance of the multilayer coating was evaluated as follows. A continuous cutting test was executed under the following condition by use of a SNGA120408 cemented carbide insert having a multilayer coating formed thereon, and the depth of crater wear of the tool cutting face was measured to evaluate the cutting performance.

Work Material: FCD400
Cutting speed: 200 m/min
Feed: 0.2 mm/rotation
Cutting depth: 3.0 mm
Cutting Condition: Dry The forming condition of the multilayer coating and the evaluation result are shown in Table 1.

[Table 1]

The following can be considered from Table 1. No. 1 is an example in which the hard coating was formed in conditions of base material temperature: 550° C. and bias voltage: −30V, and the alumina coating was formed thereafter. In No. 1, the hardness of the TiAlN coating (hard coating) after alumina coating formation is as low as about 20 GPa, and in the adhesion test, partial floating or peeling of the alumina coating from the hard coating was observed around the indentation.

No. 2 and No. 3 are examples in which the hard coating was formed with an increased bias voltage of −100V and −200V, respectively. In Nos. 2 and 3, the hardness of the TiAlN coatings (hard coating) after alumina coating formation is about 22 and 25 GPa, respectively, which are higher than that in No. 1. In an adhesion test, floating or peeling of the alumina coating from the hard coating was confirmed in both the cases, but such a floating or peeling portion was smaller than that in No. 1.

Nos. 4 and 5 are examples in which the hard coating was formed with a base material temperature of 450° C. while applying a bias voltage of −100V in No.4 and of −300V in No. 5, respectively. In No. 4, the hardness of the TiAlN coating (hard coating) after alumina coating formation was about 20 GPa, and peeling of the alumina coating was confirmed. In No. 5, the hardness was about 23 GPa, and the peeling portion was minimized.

From the results of Nos. 1–5, satisfactory adhesion between the hard coating and the alumina coating can be ensured when the hardness of the hard coating after alumina coating formation is 22 GPa or more.

Nos. 6–8 are examples in which the hard coating formation was carried out with a constant base material temperature of 550° C. while changing the bias voltage from −30V, −100V to −200V (or, the hard coating formation was carried out in the same condition as in Nos. 1–3), and then an alumina coating 1.7 μm thick was formed thereon.

In the adhesion test, no peeling was confirmed in every case, and satisfactory adhesion was observed. This may be attributable to a small thickness of the alumina coating. However, in the cutting test, the depth of crater wear reached 14 μm within 2 minutes from the start of the cutting test as in No. 6 in which the hardness of the hard coating is only about 20 GPa. In contrast, the crater wear is suppressed in Examples 4 and 5 in which the hardness of the hard coating is high. Namely, from the results of Nos. 6–8, the cutting performance can be ensured regardless of the film thickness of the alumina coating if the hardness of the hard coating can be ensured.

Nos. 9 and 10 are examples in which an intermediate layer about 10 nm thick was formed between the hard coating and the alumina coating. In No. 9, the hard coating in the alumina coating formation has a hardness of 22 GPa or more even when the Cr metal layer is formed, showing satisfactory adhesion. In No. 10, an alumina coating mainly composed of α-type crystal structure can be formed even if an alumina coating with relatively small film thickness is formed, showing that the Cr intermediate layer contributes to making the alumina crystal into α-type structure.

TABLE 1

| | | Hard coating | | | | |
|---|---|---|---|---|---|---|
| | | Deposition condition | | | | Coating |
| Experiment No. | Under layer | Substrate temperature (° C.) | Bias voltage (V) | Kind of coating | Film thickness (μm) | hardness (GPa) * |
| 1 | TiN 0.5 μm | 550 | −30 | TiAlN | 1.8 | 20 |
| 2 | TiN 0.7 μm | 550 | −100 | TiAlN | 2.0 | 22 |
| 3 | TiN 0.4 μm | 550 | −200 | TiAlN | 1.9 | 25 |
| 4 | TiN 0.5 μm | 450 | −100 | TiAlN | 2.0 | 20 |
| 5 | TiN 0.5 μm | 450 | −300 | TiAlN | 1.9 | 23 |
| 6 | TiN 0.5 μm | 550 | −30 | TiAlN | 1.8 | 20 |
| 7 | TiN 0.7 μm | 550 | −100 | TiAlN | 2.0 | 22 |
| 8 | TiN 0.4 μm | 550 | −200 | TiAlN | 1.9 | 25 |

TABLE 1-continued

| | | | | | | |
|---|---|---|---|---|---|---|
| 9 | TiN 0.4 μm | 550 | −200 | TiAlN | 1.9 | 25 |
| 10 | TiN 0.4 μm | 550 | −200 | TiAlN | 1.9 | 25 |

| Experiment No. | Intermediate layer | Alumina coating | | | Adhesion | Depth of crater wear after 2 min. in cutting test |
|---|---|---|---|---|---|---|
| | | Crystal structure | Film thickness (μm) | Coating hardness (GPa) | | |
| 1 | — | α | 3.5 | 23 | Alumina coating (AC): peeling | — |
| 2 | — | α | 3.5 | 23 | AC: minute partial peeling | — |
| 3 | — | α | 3.5 | 23 | AC: minute partial peeling | — |
| 4 | — | α | 3.5 | 23 | AC: peeling | — |
| 5 | — | α | 3.5 | 23 | AC: minute partial peeling | — |
| 6 | — | α + trace Y | 1.7 | 23 | No peeling | 14 μm |
| 7 | — | α + trace Y | 1.7 | 23 | No peeling | 8.5 μm |
| 8 | — | α + trace Y | 1.7 | 23 | No peeling | 1.2 μm |
| 9 | Cr metal layer 10 nm | α | 3.5 | 23 | AC: minute partial peeling | — |
| 10 | Cr metal layer 10 nm | α | 1.7 | 23 | No peeling | — |

* Coating hardness after alumina coating formation

What is claimed is:

1. A multilayer coating formed on a base material comprising:
    a hard coating comprising a metallic compound formed on said base material; and
    an alumina coating formed, directly or through an intermediate layer, on said hard coating,
    wherein the Vickers hardness of said hard coating after formation of said alumina coating is 22 GPa or more.

2. The multilayer coating according to claim 1, wherein said multilayer coating is formed by successively laminating said hard coating, an oxide-containing layer formed by oxidizing the surface of said hard coating, and said alumina coating.

3. The multilayer coating according to claim 1, wherein said multilayer coating is formed by successively laminating said hard coating, said intermediate layer comprising a metal or a metal compound, an oxide-containing layer formed by oxidizing the surface of said intermediate layer, and said alumina coating.

4. The multilayer coating according to claim 1, wherein said alumina coating has a crystal structure mainly composed of α-type crystal structure.

5. The multilayer coating according to claim 1, wherein said hard coating comprises a compound of a metallic component containing Al and Ti as essential components with at least one of B, C, N and O, or said hard coating includes said compound formed on the surface layer thereof.

6. The multilayer coating according to claim 5, wherein said hard coating comprises at least one of TiAlN and TiAlCrN.

7. The multilayer coating according to claim 1, wherein said multilayer coating comprises said intermediate layer and said intermediate layer comprises metal Cr or a compound of a metallic component containing Cr as an essential component with at least one of B, C, N and O.

8. The multilayer coating according to claim 7, wherein said intermediate layer is CrN.

9. The multilayer coating according to claim 1, wherein the Vickers hardness of said hard coating after the formation of said alumina coating is 25 GPa or more.

10. The multilayer coating according to claim 1, wherein the Vickers hardness of said hard coating after the formation of alumina coating is 5 GPa or less.

11. The multilayer coating according to claim 1, wherein the thickness of said hard coating is 0.5 to 20 μm.

12. The multilayer coating according to claim 1, wherein said hard coating is formed at a base material temperature that is from 0 to 200° C. less than the base material temperature of formation of the alumina coating.

13. The multilayer coating according to claim 12, wherein the base material temperature is set to a temperature of from 500° C. to 1000° C. during hard coating formation.

14. The multilayer coating according to claim 13, wherein the hard coating is formed by ion plating, and a bias voltage is applied to the base material during hard coating formation in a range of from −100V to −300V.

* * * * *